(12) United States Patent
Schertler

(10) Patent No.: US 6,364,955 B2
(45) Date of Patent: *Apr. 2, 2002

(54) CHAMBER, AT LEAST FOR THE TRANSPORT OF WORKPIECES, A CHAMBER COMBINATION, A VACUUM TREATMENT FACILITY AS WELL AS A TRANSPORT METHOD

(75) Inventor: Roman Schertler, Wolfurt (AT)

(73) Assignee: Unaxis Balzers Aktiengesellschaft, Fuerstentum (LI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/572,873

(22) Filed: May 18, 2000

Related U.S. Application Data

(62) Division of application No. 09/236,388, filed on Jan. 25, 1999, now Pat. No. 6,096,231, which is a division of application No. 08/728,610, filed on Oct. 10, 1996, now Pat. No. 5,865,588, which is a division of application No. 08/131,669, filed on Oct. 5, 1993.

(30) Foreign Application Priority Data

Oct. 6, 1992 (CH) ................................. 3119/92
Mar. 11, 1993 (CH) ................................. 757/93

(51) Int. Cl.[7] .......................... C23C 16/00; B65G 35/00
(52) U.S. Cl. .................................. 118/719; 204/298.25
(58) Field of Search ................ 414/935, 936, 414/937, 938, 939, 940, 941; 118/719; 427/255.5; 438/716; 204/298.25, 298.26, 298.35

(56) References Cited

U.S. PATENT DOCUMENTS

| | | | | |
|---|---|---|---|---|
| 3,477,050 A | * | 11/1969 | Hinger | 414/606 |
| 3,968,885 A | | 7/1976 | Hassan et al. | |
| 4,588,343 A | * | 5/1986 | Garrett | 414/221 |
| 4,643,627 A | * | 2/1987 | Bednorz et al. | 414/217 |
| 4,664,578 A | * | 5/1987 | Kokehi | 414/941 X |
| 4,795,299 A | * | 1/1989 | Boys et al. | 414/939 X |

(List continued on next page.)

FOREIGN PATENT DOCUMENTS

| | | |
|---|---|---|
| DE | 2445559 | 4/1975 |
| DE | 3912295 | 10/1990 |
| DE | 4117969 | 12/1992 |
| EP | 0136562 | 4/1985 |
| GB | 2120627 | 12/1983 |

*Primary Examiner*—Jeffrie R. Lund
*Assistant Examiner*—Slyva R. MacArthur
(74) *Attorney, Agent, or Firm*—Crowell & Moring LLP

(57) ABSTRACT

At least one chamber is provided for transport of workpieces such as storage disks, at least at times, into the vacuum atmosphere, during their manufacturing and comprises at least two exterior openings for the guiding-through of a workpiece. A majority of workpiece-receiving devices can be rotated jointly about an axis. At least one transport element is provided and is aligned with an opening. The transport element is disposed in the chamber independently of the rotatable workpiece-receiving devices and can be moved out and back in a radially controlled manner in at least one component, and engages on a workpiece in the opening area. A transport method for workpieces in an evacuatable chamber provides that at least two workpieces are rotated about a center in a plane of rotation and are displaced individually in a radial manner with respect to the center of rotation at least in one movement component.

16 Claims, 14 Drawing Sheets

U.S. PATENT DOCUMENTS

| | | | | |
|---|---|---|---|---|
| 4,886,412 A | * | 12/1989 | Wooding et al. | 414/941 X |
| 4,951,601 A | * | 8/1990 | Maydan et al. | 414/935 X |
| 4,969,790 A | * | 11/1990 | Petz et al. | 414/217 |
| 5,000,652 A | * | 3/1991 | Christensen et al. | 414/744.8 X |
| 5,061,144 A | * | 10/1991 | Akimoto et al. | 414/935 X |
| 5,145,227 A | * | 9/1992 | Monford, Jr. | 294/65.5 |
| 5,224,581 A | * | 7/1993 | Ebbing et al. | 198/345.1 |
| 5,227,708 A | * | 7/1993 | Lowrance | 318/640 |
| 5,310,410 A | * | 5/1994 | Begin et al. | 414/217 X |
| 5,340,261 A | * | 8/1994 | Oosawa et al. | 414/217 |
| 5,662,785 A | * | 9/1997 | Schertler | |
| 5,820,329 A | * | 10/1998 | Derbinski et al. | 414/225 |
| 5,863,170 A | * | 1/1999 | Boitnott et al. | 414/222 |
| 5,865,588 A | * | 2/1999 | Schertler | 414/217 |
| 5,879,128 A | * | 3/1999 | Tietz et al. | 414/757 |
| 6,096,231 A | * | 8/2000 | Schertler | 216/41 |

* cited by examiner

CHAMBER, AT LEAST FOR THE TRANSPORT OF WORKPIECES, A CHAMBER COMBINATION, A VACUUM TREATMENT FACILITY AS WELL AS A TRANSPORT METHOD

This application is a divisional of application Ser. No. 09/236,388, filed Jan. 25, 1999, now U.S. Pat. No. 6,046, 231, is a divisional of application Ser. No. 08/728,610, filed Oct. 10, 1996, now U.S. Pat. No. 5,865,588 which is a divisional of Ser. No. 08/131,669, filed Oct. 5, 1993.

The present invention relates to a chamber according to the preamble of claim 1, to a chamber combination according to the preamble of claim 2, to a vacuum treatment facility according to the preamble of claim 12 as well as to a transport method according to the preamble of claim 13.

For the transport of workpieces, particularly of storage disks, such as CD's, magnetic or magneto-optic storage disks, in a chamber of a vacuum treatment facility, for example, for the treatment of the workpieces by reactive or non-reactive vacuum processes, such as etching processes, physical or chemical coating processes with or without glow discharge support, it has been known for a long time to provide a plurality of workpiece receiving devices which can be rotated jointly about an axis in an alignment with provided exterior openings of the chamber. Reference can be made in this respect to U.S. Pat. No. 3,856,654 or German Patent Document DE-PS 24 54 544.

According to U.S. Pat. No. 3,856,654, it is known to rotate frame-type workpiece receiving devices in the chamber about an axis in the manner of a carrousel. When a frame containing the workpiece has reached the alignment position with the exterior opening of the chamber on which a working station is mounted, the workpiece is pushed into the treatment position by means of a lifting element which operates in parallel to the axis of rotation. This resulted in a three-dimensional displacement path for the workpieces, specifically in two dimensions according to the plane of rotation of the carrousel and in a third dimension, in parallel to the axis of rotation of the carrousel out of the chamber.

German Patent Document DE-PS 24 54 544 suggests a configuration in which the displacement path in the third dimension is reduced considerably in order to achieve a more compact construction of the facility. For this purpose, the workpieces are displaced in the treatment position only slightly in parallel to the axis within the framework of the suspension by means of which workpiece receiving frames are disposed on the rotating carrousel so that they can be displaced in the axial direction. For this purpose, a ram, which is mounted to be aligned with the respective exterior opening with the treatment station, engages on the workpiece holding frame, opposite the treatment chamber. Thus the wall of the treatment station mounted to the exterior opening of the chamber is completed by means of a part rotating with the carrousel.

In the case of the facilities according to German Patent Documents DE-OS 39 12 295, 40 09 603, 37 16 498 and European Patent Document EP-A 0 389 820, this principle is also pursued in partially constructive variants.

However, in the manufacturing processes, particularly of the above-mentioned circular-disk-shaped workpieces, it becomes more and more necessary to carry out a plurality of individual treatment steps on a corresponding number of treatment stations. The approach in which the workpieces in the treatment position were lifted only minimally on the transport plane of the workpiece holding carrousel is only a limited remedy in this case because the available space on the chamber with the carrousel is limited.

It is a first object of the present invention to solve this problem based on a chamber with a carrousel-type conveyer of the type indicated in the preamble of claim 1.

The characterizing part of claim 1 of the invention achieves this purpose.

In addition to the plurality of workpiece receiving devices—the carrousel—disposed so that they can be rotated about an axis, a transport element is provided which can be moved out and back at least in one motion component radially to the above-mentioned axis in a controlled manner and which is disposed in the chamber independently of the carrousel. As a result, it becomes possible to particularly radially move the workpiece back and forth at given rotating positions, specifically when a receiving device on the carrousel is aligned with one of the exterior openings of the chamber to be serviced, with a stroke that can be selected according to the circumstances so that, starting from the carrousel, the workpieces can be conveyed through the exterior openings and nevertheless, in the event of an only radial movement, the two-dimensionality of the transport path is fully maintained and in the event of a movement of the transport element that is only partially radial, if desired, the extent of the transport movement in the third dimension can be selected arbitrarily. Since the carrousel diameter is determined by the size and mainly by the number of its workpiece receiving devices, and the axial dimension of the chamber does not affect this possible number, according to the invention, the linear stroke of the transport element is placed in a plane of the chamber which is large as a result of the number. Thus, without any enlargement of the chamber, space is available for a long transport stroke.

With respect to a second object of the invention, it was recognized that it is an additional disadvantage of the previously known carrousel transport techniques that additional elements are provided on the chamber in order to—even though partially to a minor extent—transport the workpieces from the carrousel transport plane in the direction of the respective treatment stations. The providing of such additional elements particularly stands in the way of a flexible conception of facilities of different configurations that is adapted to the requirements because of the fact that the interaction of the carrousel and the additional elements is aimed at the respective chamber configuration with its specifically provided exterior openings.

If, for example, in such a configuration of the facility, one of the provided exterior openings is not lined up with a treatment station but is closed by means of a cover, the additional transport element must nevertheless be provided and assigned to this opening in order to be able to use the same chamber in a different configuration of the facility.

Based on these above-mentioned previously known chambers, it is an object of the invention to provide a chamber in the case of which the mutual physical arrangement of the exterior openings with respect to an axis of rotation about which, in this case, at least one workpiece receiving device rotates, can be selected arbitrarily within wide limits and/or which provides the possibility of being able to construct overall facilities to be extremely compact while the efficiency is high.

This object is achieved in the German Patent Application P 41 17 969.2 with parallel applications in Europe No. 92 108 771.4, in the U.S. Ser. No. 07/888 111, in Japan No. 4-140 357. A chamber is described there in the case of which the workpiece receiving devices are arranged on a transport element which, as a whole, is disposed to be driven about the axis in a rotationally movable manner and which, in addition, can be linearly moved and moved back with respect to this axis. This can significantly increase the compactness of treatment facilities of this type if, according to the second aspect of the present invention, an approach according to claim 2 is followed which also significantly increases the constructive degree of freedom.

In a preferred chamber combination according to FIG. 3, a chamber according to claim 1 is provided as an additional chamber, that is, a chamber comprising the workpiece receiving carrousel and a radially operable transport element which is disposed independently of it.

In the case of the latter chamber—the "carrousel chamber"—whether separately or in the above-mentioned combination, it is preferably suggested according to claim 4 that the sport element which is disposed independently with respect to the plurality of rotatable workpiece receiving devices is non-rotatably disposed in the chamber. However, it is also definitely possible to arrange this transport element rotatably with respect to the axis of the carrousel but independently of the latter, whereby, for example, by means of such a transport element, several exterior openings may be serviced, whereas, in the preferred embodiment according to claim 4, one transport element, which is disposed in a non-rotatable manner, must be assigned to each exterior opening to be serviced by it.

In the case of a chamber with the carrousel or in the case of a chamber combination with this chamber on the latter, or on a chamber combination with a chamber in the case of which the transport element is constructed to be rotationally movable and linearly displaceable, it is achieved according to the approach of claim 5 that a workpiece which travels through this chamber toward a treatment and then travels back through this chamber from the treatment, remains much longer in the chamber on the way there than on the way back. As a result, a conditioning of the workpieces in this chamber becomes possible before their treatment, such as a degasification, for the purpose of which the mentioned chamber may definitely be heated or another pretreatment process may be used.

Mainly the chamber with the carrousel is preferred for this purpose because, in this case, a significantly larger number of workpiece receiving devices may be provided on the carrousel than on the chamber on which the transport element is disposed in a rotationally movable as well as linearly movable manner, specifically with much lower expenditures, if it is considered that the enlargement of the carrousel is only a question of the chamber dimension, whereas the multiplying of the rotationally and linearly movable transport elements results in a significant increase of the complexity of the chamber.

On the chamber with the carrousel as well as on the chamber with the rotationally and linearly moved transport element and thus also on the chamber combination, it is preferred according to claim 6 to design at least one transport element so that it can be moved out and back at a right angle with respect to the pertaining axis of rotation. This consequently maintains the two-dimensionality of the transport path, whether this is in addition to the two-dimensional transport path with the carrousel or in addition to the rotating movement and thus to the two-dimensional movement of the transport element.

Although it is easily possible to arrange on all chambers or chamber combinations described here disk-shaped workpieces with their disk face in the respective rotating planes, and thus to arrange the workpiece receiving devices correspondingly, it is preferred according to claim 7 to arrange for such disk-shaped workpieces the workpiece receiving device in such a manner that its receiving surface during the rotation, whether of the carrousel or of the transport element, sweeps over a cylindrical surface.

The chamber with the carrousel or a chamber combination with this carrousel chamber is also preferably constructed according to claim 8.

As a result, it is achieved in a constructively simple manner that the carrousel drive and the drive of the additional transport element, whether this is a rotational and radial drive or only a radial drive, can be separated in the chamber in a space-saving manner.

The above-mentioned chamber with the carrousel, also in the above-mentioned combination, is also preferably constructed according to claim 9.

As a result of the fact that the receiving devices are disposed in a radially springy manner, they may, if they are aligned to an exterior opening to be serviced, be placed against the opening border by means of the transport element until a vacuum-tight closure is achieved, whereby, viewed from the interior of the chamber, the workpiece receiving device on the mentioned opening is situated outside the chamber while the opening closure is tight, and the mentioned workpiece receiving device can therefore be serviced from the outside of the chamber by the inserting or removing of a workpiece without any undesirable impairment of the atmosphere in the respective chamber.

Furthermore, controlled holding elements are provided particularly on the workpiece receiving devices of the chamber with the carrousel according to claim 10, in which case it should be explicitly mentioned, however, that such holding elements may also be provided on the workpiece receiving device on the transport element which may be provided in a rotationally movable as well as in a linearly movable manner.

In a further preferred variant according to claim 11, it is provided on the chamber with the carrousel or on the chamber with the linearly and radially movable transport element of the combination that at least some of the exterior openings are tightly, preferably vacuum-tightly, closable by the effect of the at least one transport element.

In the case of the chamber with the carrousel, this is implemented by the at least one transport element which can be radially moved out and back; in the case of the chamber combination, it is implemented by the rotationally movable and linearly displaceable transport element.

If, in the case of the above-mentioned combination, a chamber with a carrousel and one with a linearly and rotationally movable transport element are combined, a respective common exterior opening of the chambers is closed off tightly, preferably vacuum-tightly, preferably by the transport element of one chamber as well as by that of the other chamber.

Depending on the requirement of the atmospheric uncoupling of the two chambers, a sealing may be sufficient by means of a gap sealing (diaphragm gland) in the sense of a pressure stage, or both chambers are separated in a vacuum-tight manner.

A vacuum treatment facility comprising a chamber with a carrousel or with the above-mentioned chamber combination is achieved according to claim 12.

The transport method according to the invention is achieved in claim 13 with preferred embodiments according to claim 14.

In the following, the invention will be explained in the manner of embodiments by means of figures.

First, by means of FIGS. 1, 2, 2a, a configuration of the facility is to be described which is currently preferred and which comprises the approach according to the invention. For reasons of clarity, FIG. 1 is more schematic than FIG. 2. Identical reference numbers are used in FIGS. 1 to 2a.

Figure 1:
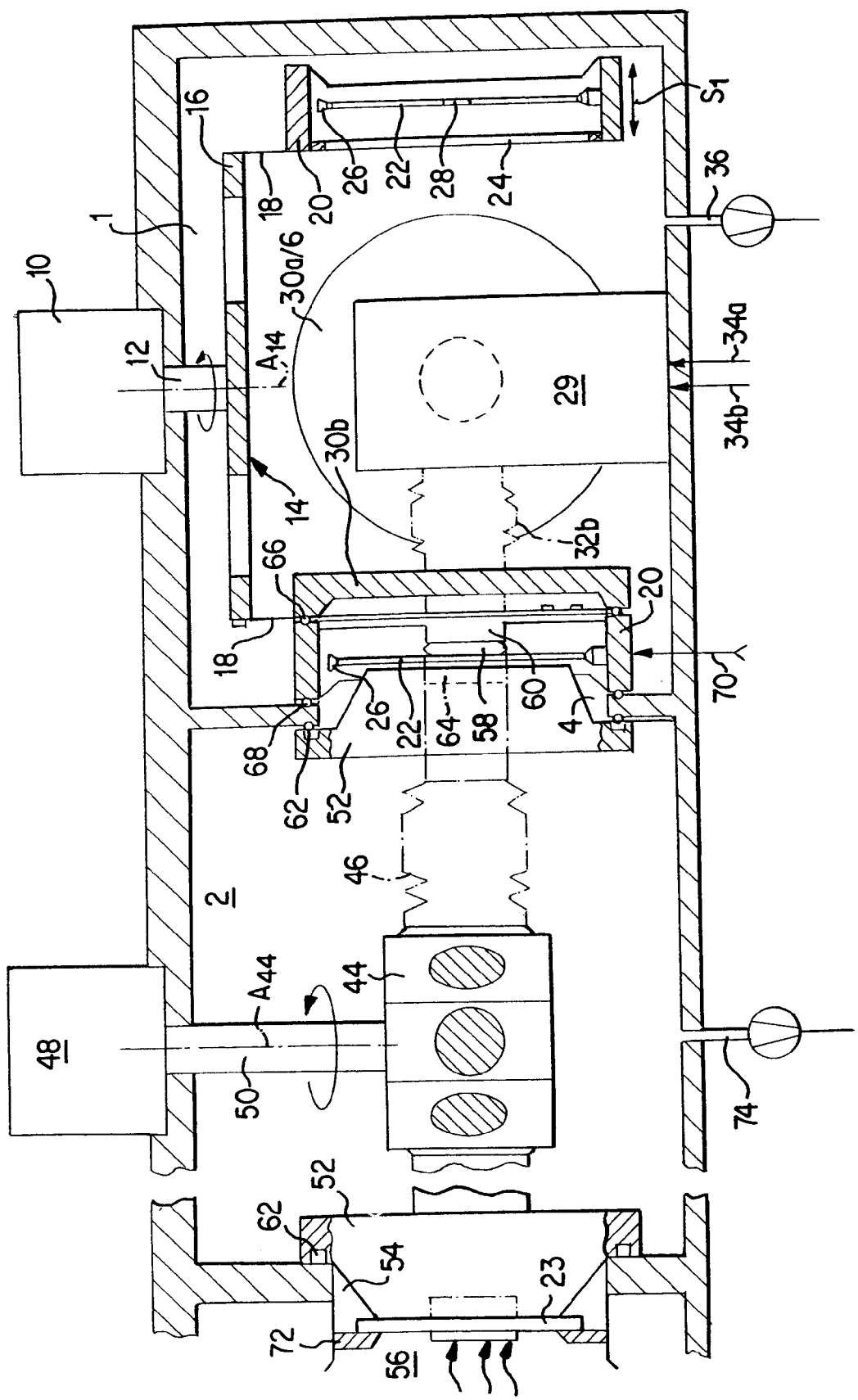
FIG. 1 is a schematic longitudinal sectional view of a preferred configuration of the facility, in which case the invention is implemented with respect of its two objects.

The facility comprises a first chamber 1 and a second chamber 2 which communicate with one another by way of a connecting opening 4. The first chamber 1 is constructed as a buffer chamber and has a feeding and a removal opening 6 (FIG. 2)—lock-type pass-through opening—which can be locked in a sealing manner by means of a driven feeding and locking plate 8. A rotary drive 10 is provided which is disposed centrically on the housing of the first chamber 1 and drives a carrousel 14 by way of a drive shaft 12. The carrousel 14 comprises a transfer plate 16, on which, by way of leaf springs 18 (see also FIG. 2a) receiving devices 20 are arranged for circular-disk-shaped workpieces 22. Because of the leaf spring suspension, the receiving devices 20, as illustrated in FIG. 1 at $s_1$, can be bent out in a radially springy manner.

Figure 2:
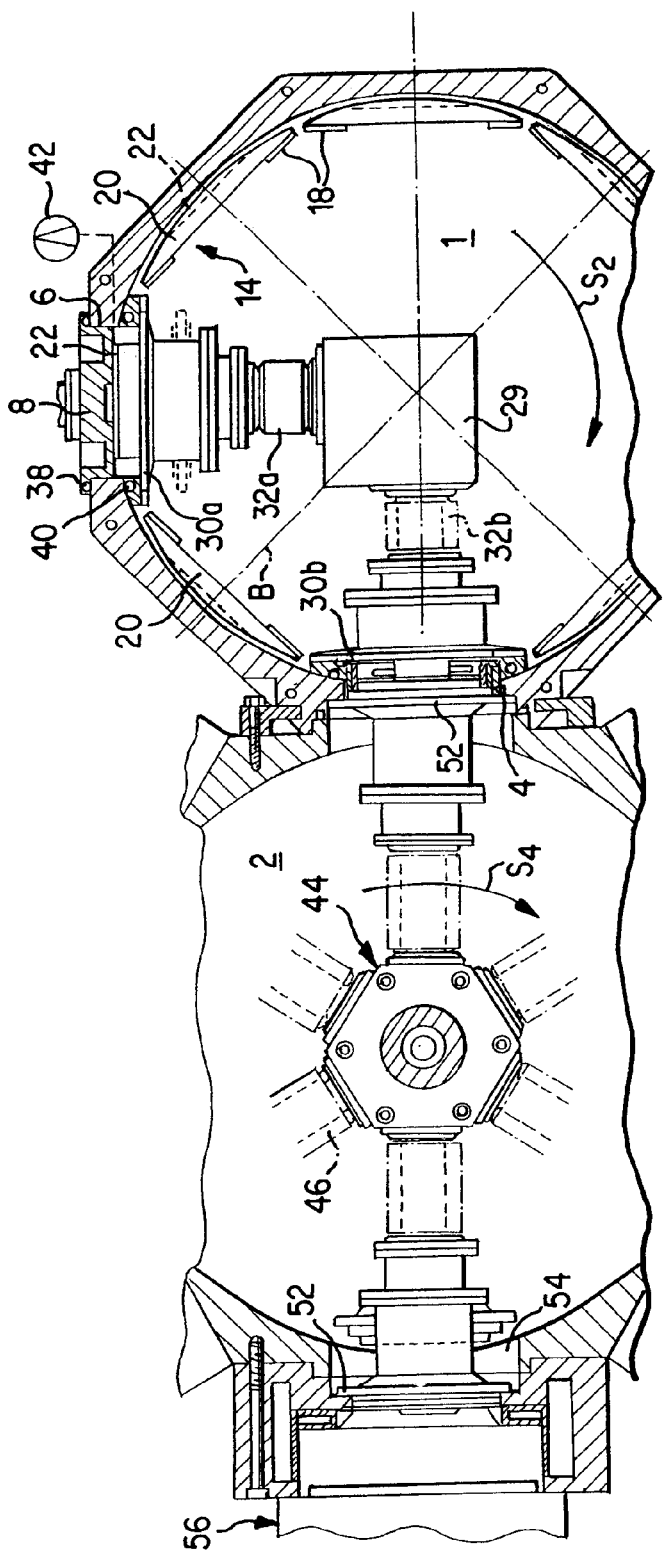
FIG. 2 is a partially sectional view of a facility according to FIG. 1.
Figure 2A:
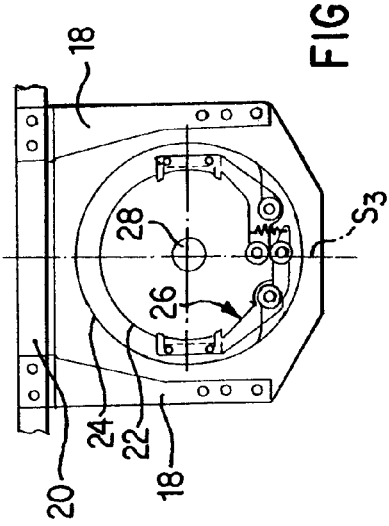
FIG. 2a is a preferred embodiment of a workpiece receiving device provided on a chamber on the facility according to FIGS. 1 and 2.

The eight receiving devices 20 provided on the carrousel 14 are designed essentially as a frame, as indicated particularly in FIG. 2a. In the perpendicular view with respect to the dimensional surface of the workpieces 22, they have a reach-through opening 24 as well as a holding mechanism 26 for the workpieces 22 above the reach-through opening 24 which acts in the manner of tongs and, for reasons of clarity, is entered only in FIG. 2a. Because of the edge-side arrangement (FIG. 2a) of the leaf springs 18, the reach-through opening 24 remains free.

The workpieces—in this case, storage disks—have a center opening 28. As a result of the step-by-step rotating of the carrousel 14, the receiving devices 20 are rotated sequentially over the openings 4 and 6 of the chamber 1.

As illustrated particularly also in FIG. 2, a bearing base 29 which, with respect to the axis $A_{14}$ of the carrousel 14 in chamber 1, is mounted rigidly opposite the transfer device 16 on the housing of the chamber 1. Two plates 30a and 30b, which can be slid in and out radially independently of one another, are arranged on this bearing base 29 and are correspondingly aligned with the two openings 4 and 6 which are, for example, provided here. With respect to vacuum technology, the driving elements for the plates 30a and 30b, are sealed off or shut off by means of bellows 32a,b. As illustrated schematically in FIG. 1, pneumatic control pipes 34a and b are guided into the block 29. As indicated schematically by reference number 36 in FIG. 1, the chamber 1 has a pump connection 36 for its conditioning, and may possibly also have gas connections.

By means of the principle of the carrousel with a plurality of receiving devices 20 for workpieces and the radially acting plates 30 implemented on the chamber 1, it is achieved—as illustrated—that a higher number of workpieces is contained in this chamber than handled momentarily by the provided openings, which results in the important advantage that the workpieces which are momentarily not manipulated with respect to the mentioned openings may be conditioned in this chamber and, in particular, may be degasified. This may also be promoted by heating or other known pretreatments.

It is another advantage that the handling of the workpieces with respect to the above-mentioned openings takes place in the same plane in which the workpieces are rotated in chamber 1 by means of the carrousel. This opens up the possibility of constructing an overall facility with the chamber 1 and additional chambers arranged on its openings—whether these are additional transport or distributing chambers, or treatment chambers or lock-type pass-through chambers—in a modular, compact and also radial manner and therefore flat, if desired.

Naturally, when looking at it separately, more than two openings may be provided on the chamber 1 and may be serviced radially by correspondingly arranged plates 30. In this case, the simplicity of the construction is maintained because the carrousel is very easy to drive and the radial manipulating movements may be controlled from a stationary center, whereby this control also becomes much simpler than in cases in which the rotating movement and the axial movement are coupled. However, while maintaining this simple construction, it is in principle also possible to rotate the base 29 with the plates 30 in a driven manner about the axis $A_{14}$, but independently of the carrousel 14. Thus, more openings can be serviced with fewer plates 30. This is particularly applicable when the openings do not have to be tightly closed, as, for example, when the sealing by means of diffusion gap sealing devices is sufficient for a considered application.

In the case of the construction illustrated here, the opening area at the opening 6 is used as an actual inlet and outlet lock for workpieces, while the chamber 1 is actually used for the conditioning of workpieces brought in from the atmosphere before they are transported through opening 4 toward a treatment station in a manner that will be described in the following.

The function of the workpiece supply and removal through the opening 6 which is constructed as the actual lock will now be explained on the basis of the specifically illustrated configuration of the chamber 1.

By rotating the carrousel 14 in the direction entered as $s_2$ in FIG. 2, when the plate 30$a$ is moved back and naturally, when the feeding/locking plate 8 is sealingly shut by way of sealing devices 38, a receiving device 20 is rotated into the opening area, for example, with a finished workpiece. Then, by means of the plate 30$a$, against the effect of the springs 18, the concerned receiving device 20 is placed with the sealing devices 40 sealingly against the wall of the chamber 1, in which case sealing devices between the receiving device 20 and the plate 30$a$, which are not shown, ensure the vacuum-tight shutting of the opening 6 with respect to the chamber 1.

After the release of the holding mechanism 26, the workpiece 22 is, for example, magnetically, pneumatically or mechanically taken over by the feeding/locking plate 8 from the receiving device 20 under the effect of an actuating ram, as illustrated in FIG. 2$a$ at $s_3$. While the tight closure of plate 30$a$ by way of receiving device 20 on the wall of the chamber 1 is maintained, the feeding/shutting plate 8 may now be lifted off, the treated workpiece is removed from it and a workpiece is inserted that is to be newly treated. The plate 8 is now again sealingly shut with the new workpiece to be treated; on the now vacant receiving device 20, the holding mechanism takes over the new workpiece to be treated, whereupon the plate 30$a$ is moved into the return motion position which is shown by an interrupted line in FIG. 2. The carrousel is therefore free to continue to rotate one step farther into direction $s_2$.

As illustrated by an interrupted line at 42 (FIG. 2), the opening 6 may be connected with a pump 42 by way of a pump connection when maximal purity requirements exist with respect to the atmosphere in the chamber 1. In view of the extremely small volume of the opening area 6 acting as the pass-through lock, however, the dilution ratio provided by the volume in the opening area 6 to the volume of the chamber 1 may be sufficient for normally ensuring sufficient purity of the atmosphere in the chamber 1.

As mentioned above, the plate 8 may be constructed as a transport plate and may be part of a transport mechanism in an additional chamber flanged to opening 6, or a transport mechanism of a different type can feed workpieces through the opening 6 to the carrousel 14 or remove them from there. In addition, it is also easily possible to provide, for example, in radial position B, a removal pass-through lock which may have, for example, an identical construction as the one described in connection with the opening 6 and to feed the workpieces to the chamber 1 and remove them from it in two different areas.

As mentioned above, more than two plates 30 may be provided in order to service a corresponding number of openings provided in the chamber 1—in an extreme case, a number that corresponds to the number of provided receiving devices 20.

As illustrated in FIG. 2, the transport path for the workpieces from their feeding into the chamber 1 to their delivery from the chamber 1 toward a treatment station is much longer than the transport path from a treatment station back into the chamber 1 and from there to the delivery of the workpiece from the chamber 1. In principle, when chamber 1, whatever its design may be, is utilized as a conditioning chamber for workpieces before their treatment, the transport path for workpieces from a feeding opening to a delivery opening for workpieces to be treated is selected to be longer than the transport path for treated workpieces from a respective receiving opening to a respective delivery opening, even if the feeding/delivery openings are combined, as illustrated in FIG. 2, for example, in the shape of inlet/outlet pass-through locks. As a result, the dwell time of the workpieces in chamber 1 as the pre-chamber is extended during which the workpieces may emit water vapor and gas. The workpieces are therefore prepared (conditioned) for subsequent treatment steps. This is particularly important in the case of materials which have a high gas or water absorption, as, for example, plastic materials which are normally used for storage disks. An excessive gas evolution from the workpieces on the processing stations can therefore not be tolerated because, as a result, the coating of the workpieces may become unserviceable.

In the following, chamber 2 and its interaction with chamber 1 will be discussed.

In chamber 2, a transport star 44 is provided which comprises, for example, six transport arms 46 and which is driven by means of a drive 48 by way of shaft 50 in a rotating manner. On the end, plates 52 are arranged on the arms 46 which can be driven radially forward and backward by means of driving elements which are sealed off in a vacuum-tight manner. By way of the opening 4, the plates 52 can be swivelled to chamber 1, on the one hand, as well as to one or several additional opening(s) 54, at which, as in the illustrated example, one or several treatment station(s) may be arranged and/or additional transport chambers or lock-type pass-through chambers. In the illustrated embodiment, one treatment chamber 56 is provided.

In the following, the transfer of workpieces from chamber 1 to chamber 2 will be explained. For their surface treatment in a treatment position downstream of the opening 4, that is, in the moving direction of the workpieces behind the opening 4, the workpieces must be covered in desired surfaces areas. In the case of storage disks, which is discussed here, their center area around the opening 28 as well as their peripheral area must be covered at at least one of the treatment stations.

In a manner that will be described in the following, the central masking is ensured by a loosely supplied masking element for each workpiece to be treated, which masking element, as described in the following, will be applied before the treatment of the workpieces and will be removed from them after the treatment. The masking elements 58, which are applied to the workpieces returned on the plates 52, after their treatment, are removed in the area of the opening 4 from these already treated workpieces and are applied to a workpiece which is newly brought on the plate 52 in the chamber 2 and which is brought subsequently into the treatment position by means of the rotation of the transport star 44. For this purpose, a solenoid is arranged centrically on the non-rotatable plate 30$b$ of chamber 1.

In the rotating direction $s_4$, which is illustrated, for example, in FIG. 2, a disk-shaped workpiece 22 of the addressed type is transported into the position opposite the opening 4 shown in FIG. 1. The corresponding plate 52 is placed by means of sealing devices 62 tightly against the bordering of the opening 4. The workpiece 22 which is astride on it and is held by a magnet 64, preferably a permanent-magnet, is pushed into the opening 4 in this manner. During the rotating movement of the plate 52 about the shaft 50 or A 44, a receiving device 20 without any workpiece, thus an empty receiving device 20, remains positioned above opening 4. In this case, the plate 30*b* presses this empty receiving device 20 by way of sealing devices 66 and sealing devices 68 tightly onto the bordering of opening 4 on the side of chamber 1, so that, during the rotating movement of the transport star 44, the two chambers 1 and 2 are separated in a sealing manner, if necessary, in a vacuum-tight manner.

When now, the plate 52, when it is positioned, ensures this separation by means of the sealing devices 62 on the side of the chamber 2, the solenoid 60 on plate 30*b* is activated, the masking element 58 made of the magnetic material is gripped and, by the withdrawal of the plate 30*b*, is disengaged from the workpiece 22 and the plate 52. By the actuating of a ram, which is illustrated schematically in FIG. 1 at reference number 70, the holding mechanism 26, according to FIG. 2*a*, in the receiving device 20, grips the treated workpiece 22. After the withdrawal of the plate 30*b* with masking element 58, which is magnetically held on it, the carrousel 14 is rotated by one step in the direction $S_2$, whereby a receiving device 20, which is loaded with a workpiece that is not processed, is rotated over the opening 4. The previously treated workpiece from which the masking element was removed is now situated by means of its assigned receiving device 20 according to FIG. 2 in the angular position B. By advancing the plate 30, still with the previously received masking element 58, the latter is applied to the newly supplied workpiece 22. By means of the sealing devices 66 and 68 on the now newly pushed-in receiving device 20, the separation of the chambers is ensured again.

The solenoid 58 will now be deactivated, whereby the magnet 64 pulls the masking element 58 with the workpiece to the plate 52 and holds it. By means of the ram 70 which is constructed tightly—preferably vacuum-tightly (bellows)—the holding mechanism 26 is released for this purpose.

Thus, the workpiece is now disposed on the plate 52 in a masked manner. The receiving device 20 is empty and is ready to receive a treated workpiece in the next cycle. The freshly loaded plate 52 is moved back; the separation of the chambers is ensured by plate 30*b* and the empty receiving device 20. By means of the rotation of the transport star 44, the just loaded workpiece is, on the one hand, rotated farther toward its treatment position; on the other hand, an already treated workpiece is rotated in position opposite the empty receiving device 20. The sealing device 68 is, for example, arranged on the receiving device 20 and, in the case of the contact against the opening 6 illustrated here, it has a lock-tightening task. Like the sealing device 68, the sealing devices 66 and/or 62 may also be constructed as diffusion gap sealing devices if, in the case of less difficult treatment processes, a vacuum-tight separation between the chambers 1 and 2 is not required or, for example, treatment and/or transport chambers, which are connected behind the chamber 2, have separate separating elements and conditioning devices.

When one arm 46 of the transport star 44 respectively is positioned opposite a treatment stations or the opening leading to it, such as 54, its plate 52 is advanced and, for example, and if necessary, is placed by means of the sealing devices 62 against the bordering of the opening 54. The surface treatment of the masked workpiece 23 will now take place, either, for example, by an etching process or a coating process. In the illustrated embodiment for storage disks, the peripheral masking is implemented while it is mounted by means of a masking ring 72 stationarily on the treatment station 56, which ring may be constructed to be springy. However, it is easily possible, if required, to handle also peripheral or other masking elements in principle in the same manner as the central masking element 58, which will be explained by means of FIG. 4.

As mentioned above, several treatment stations may also be provided on the chamber 2 and/or certain ones of the provided openings may lead out into additional transport or distributing chambers or additional lock chambers. As illustrated schematically at reference number 74, in the case of the illustrated facility, chamber 2 may also be evacuated and conditioned separately.

The control lines for the drive of the plates 52 are guided (not shown) through the shaft 50 of the star 44.

As not illustrated in FIGS. 1 to 2*a*, the masking elements 58, when used up by means of the treatment; for example, when after several passes, their coating has become too thick, are no longer returned into the chamber 2, but are no longer lifted off, for example, with the plate 30*b*, but are moved out while remaining on the treated workpiece. Since this is preplanned, an untreated workpiece which was newly fed, as described above, by means of the receiving device 20, is fed into the chamber 1 already provided with a making element 58, whereby the used-up masking element 58 is replaced.

The present invention was illustrated by means of a preferred special embodiment according to FIGS. 1 to 2*a*.

FIG. 3 illustrates in a basic manner how the exchange of masks takes place between the two transport elements when the respective concept according to FIGS. 1, 2, 2*a* is followed.

Figure 3A:
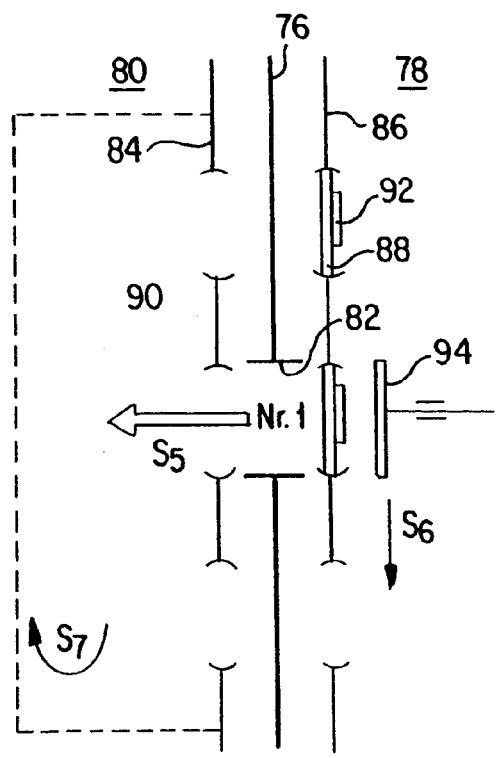
FIGS. 3a to 3f are schematic representations of the principle of the masking in a preferred implementation.

According to FIG. 3*a*, two chambers 80 and 78 are separated by the partition 76 with the opening 82. In each chamber, a transport device is arranged which, in this case, is schematically illustrated as a belt conveyor 84 and 86. On each of the conveyors, controllable holding elements for the workpieces 88 are provided, as illustrated schematically at reference number 90. The transport direction of the workpieces 88 toward the treatment position takes place from chamber 78 into chamber 80, as illustrated by $s_5$. The operation of the facility will now be started.

Figure 3B:
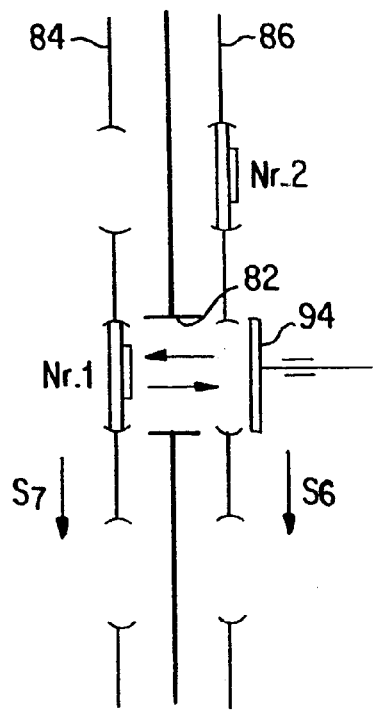
Figure 3C:
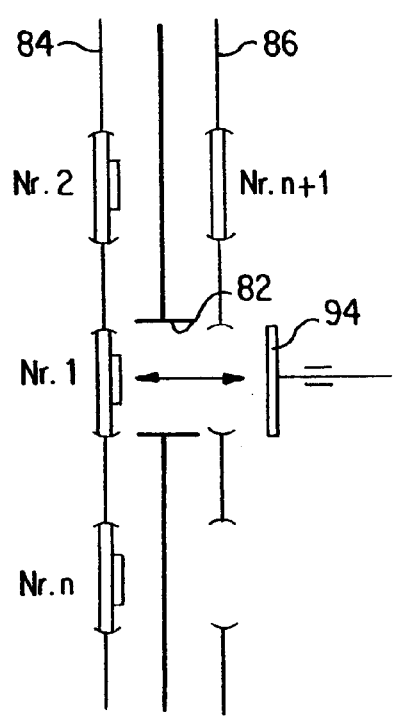
Figure 3D:
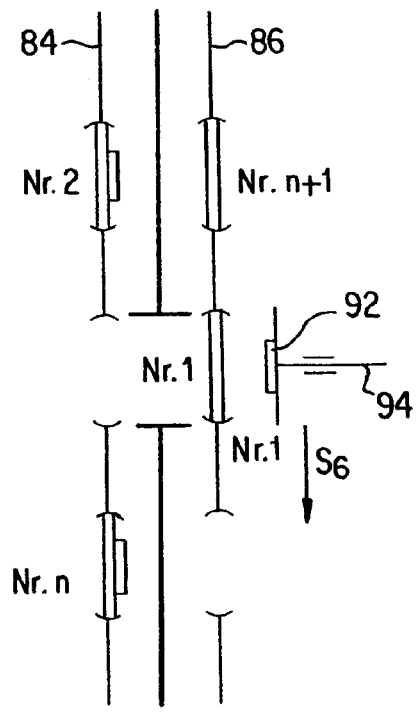
Figure 3E:
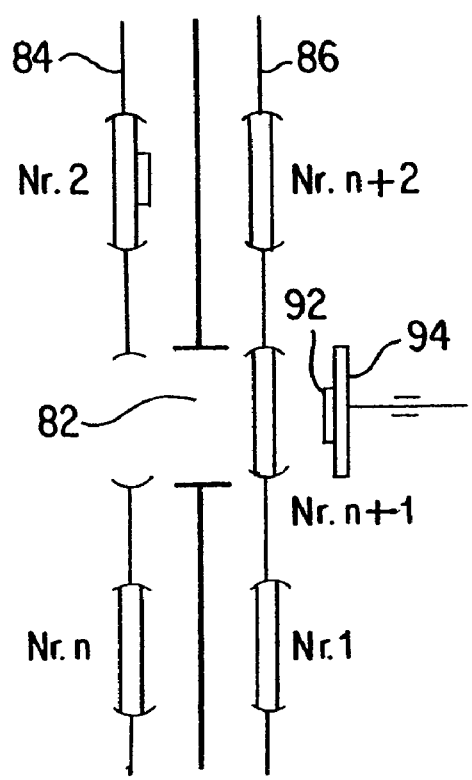

According to FIG. 3*a*, the transport device 84 is empty in this case, while, by means of the transport device 86, workpieces 88 are supplied together with the masking elements 92 constructed as separate parts, in the direction indicated by means of $s_6$. The first supplied workpiece No. 1 is conveyed by way of opening 82 and, as illustrated in FIG. 3*b*, is pushed by means of the transverse transport element 94, for example, in the form of a ram, from the belt conveyor 86 through opening 82, into the conveyor 84. The conveyor 84 will now according to FIG. 3*b* be moved along in steps in the direction $s_7$ which was indicated as an example.

Figure 3F:
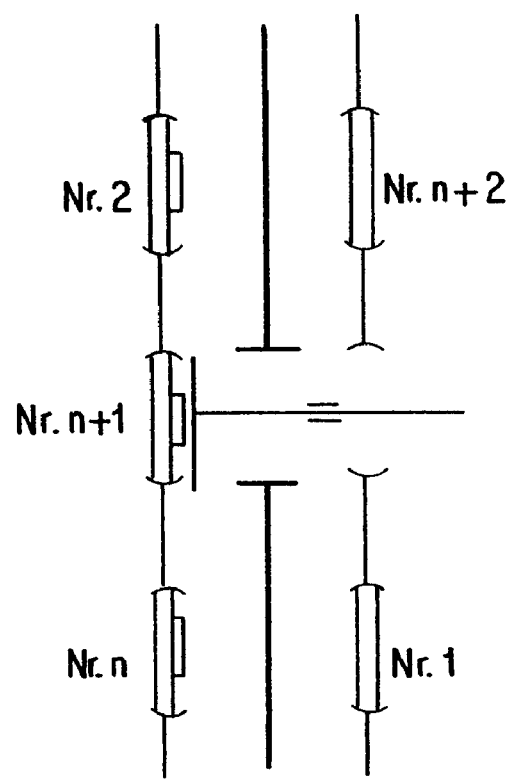

This operation continues until the cyclically circulating conveyor 84 is completely loaded with workpieces, of which some are already treated. In this case, until then, the conveyor 86 had always been emptied in the transport direction downstream of the opening 82.

n workpieces can be applied to the conveyor 84. After its treatment, the workpiece No. 1 will now, in the conveying direction, downstream of the opening 82, appear again in front of the opening 82 according to FIG. 3*c*. Workpiece No. (n+1) on the conveyor 86 is now supplied without the masking 92. As indicated by the transition to FIG. 3*d*, by means of the transverse conveying element 94, on the one hand, the treated workpiece No. 1 is transferred from conveyor 84 into conveyor 86 and, on the other hand, the masking element 92 is lifted off workpiece No. 1. Subsequently, the conveyor 86 is moved one step farther in the direction $s_6$. This results in the situation indicated in FIG. 3e: The treated workpiece No. 1 is conveyed to a delivery from chamber 78, while now workpiece No. (n+1) is disposed above the opening 82. By means of the traverse sport element 94, the masking element 92, which has already carried out one revolution from opening 82 to opening 82 through chamber 76, is applied to the untreated workpiece No. (n+1) and, as illustrated in FIG. 3f, this workpiece is transferred from conveyor 86 through opening 82 into conveyor 84.

Thus the workpiece receiving device on conveyor 86 is vacant, whereby the cycles according to FIGS. 3(c) to (f) can now be repeated.

Figure 4:
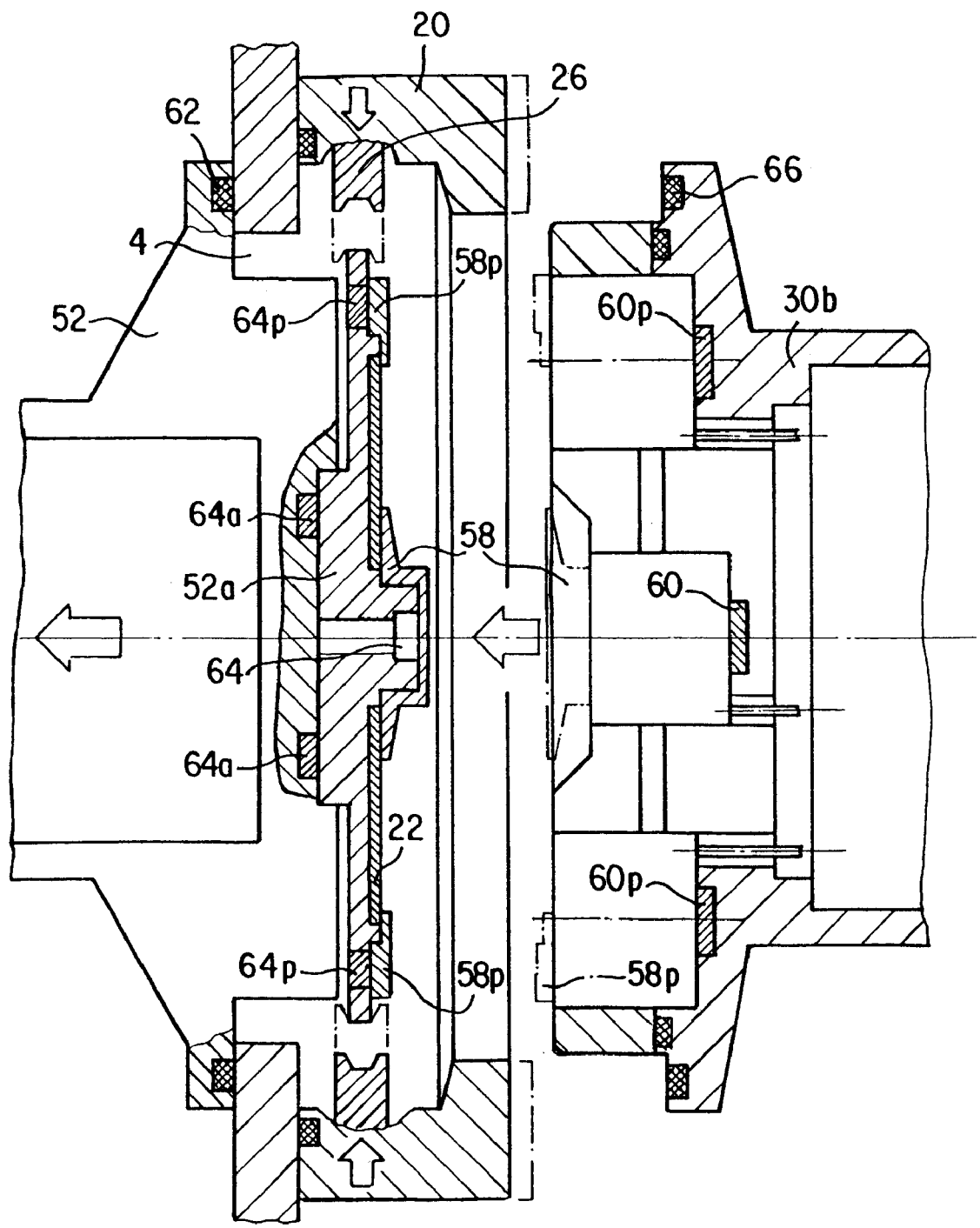
FIG. 4 is a view of the transfer area for workpieces with masking elements on a facility according to FIGS. 1 and 2 in a further embodiment.

By means of a schematically illustrated cut-out with the opening 4 on the facility according to FIG. 1, FIG. 4 shows another development of the facility in which also peripheral masking elements 58p as well as the above-described masking element 58 are exchanged. The plate 52 with the sealing devices 62 carries in the illustrated embodiment—which must not necessarily be coupled with the above-mentioned masking concept—a vehicle plate 52a which is held magnetically, preferably by means of permanent magnets 64a, on the plate 52.

The vehicle plate 52a, in turn, carries peripheral magnets $64_p$ on the side of the plate 52 as well as the central magnet 54. As described above, a receiving device 20 with its sealing devices is driven by plates $30_b$ with sealing devices 66 against the bordering of the opening 4. Solenoids $60_p$ for the peripheral masking element 58 p and 60 for the central masking element 58 are provided on plate $30_b$. By means of the magnets $60_p$, the transfer of the peripheral masking element 58p is carried out analogously to the above-described transfer concerning the masking element 58.

The vehicle plate 52a may by a workpiece adapter plate which is in each case exchanged corresponding to the workpieces 22 to be treated. Together with the respective workpiece 22, it travels through at least a portion of the workpiece transport path. As illustrated schematically, if the vehicle plate 52a is provided, the holding mechanism 26 will be applied to the latter.

Figure 5:
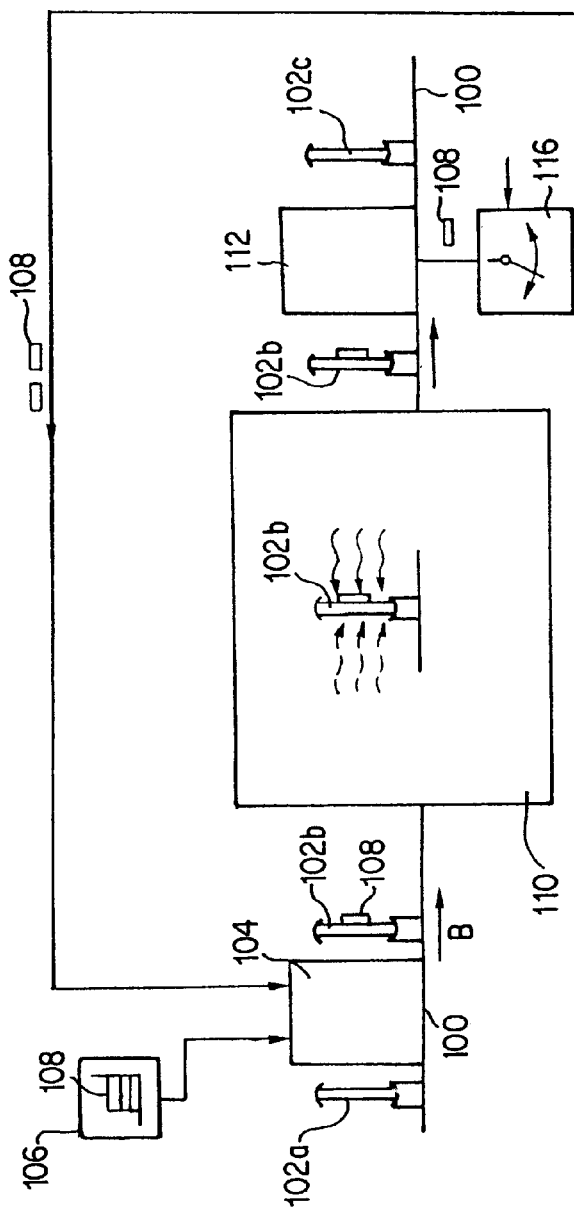
FIG. 5 is a schematic representation of the fundamental principle of the masking.

For illustrating the general aspects of the described masking process and of the facility, FIG. 5 shows its fundamental principle. As outlined schematically, on a conveyor 100, workpieces 102a without masking are fed to an application station 104 which operates along the conveyor 100 and therefore the moving path B of the workpieces 102 and which is fed with loose masking elements 108 from a hopper 106. On the outlet side of the application station 104, that is, the station at which the masking elements 108 are applied to the workpieces 102a, the workpieces 102b, which are now provided with the masking element 108, are transported to one or several treatment stations, which are represented in general in FIG. 5 by the vacuum surface treatment arrangement 110, in which the mentioned workpieces 102b are surface-treated on one side or two sides or on all sides. On the delivery side of the arrangement 110, the now treated and still masked workpieces 102 are guided to a removal station 112 operating along the moving path B of the workpieces and leave the removal station 112 as treated workpieces 102c without any masking element 108. The masking elements 108 removed at station 112 are either fed back to the application station 104 or, if they are used up after several return cycles because of the effect of the treatment arrangement 110, are withdrawn from circulation, as indicated at reference number 114. This takes place by means of a schematically illustrated controlled selection unit 116.

Figure 7:
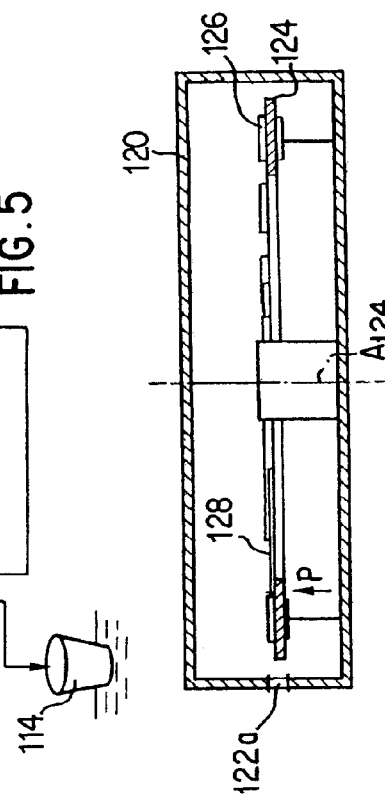
FIG. 7 is a view of another variant of the chamber according to the invention analogous to the chamber illustrated in FIG. 6.
Figure 6:
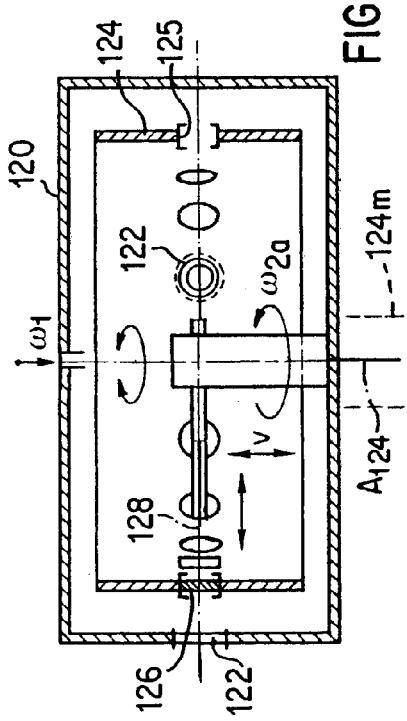
FIG. 6 is a schematic and partially sectional view of a chamber according to the invention, as used on the facility according to FIGS. 1 and 2, for the explanation of the fundamental principle of the invention according to one of its objects.

FIGS. 6 and 7 will illustrate the generally valid principle of the transport technique as implemented in the preferred facility according to FIGS. 1 to 2a in chamber 1.

According to FIG. 6, in the transport chamber 120, which by itself and/or by means of at least one of the at least two provided chamber openings 122 can be conditioned with respect to vacuum technology, a carrousel 124 is provided which, as indicated at reference symbol, is driven in a controlled manner to carry out rotations. Holding elements 125 of any type which may be controlled, if required, are provided for workpieces 126 on the carrousel. According to the development according to FIG. 6, for example, disk-shaped workpieces 126 are held and transported on the carrousel 120 in such a maimer that their disk surfaces, during the rotation about the axis of rotation of the carrousel 124, grip a cylindrical surface. Pushing elements 128 are provided which, in a preferred variant, can be moved out and returned while being radially controlled in a non-rotatable manner with respect to the axis of rotation $A_{124}$ of the carrousel 124. If they are non-rotatable, their number is equal to the number of openings 122 in the chamber 120 which they are to service, which number, however, does not absolutely have to be equal to the total number of openings provided on the chamber 120 through which the workpieces travel.

The carrousel 124 is preferably driven in steps to carry out rotations so that in each case one receiving device 125 respectively is aligned to one chamber opening 122 to be serviced, whereupon, by means of the pushing element 128, which is fixedly assigned to the mentioned chamber opening 122, the positioned workpiece 126 is delivered in the direction out of chamber 120 or, reversely, a workpiece is returned or moved in through the mentioned opening 122 from the outside of chamber 120.

As illustrated, more workpieces 126 can be intermediately stored on such a transport chamber 120 in an atmosphere that is conditioned in a targeted manner, than pushing elements 128 are provided. The rotating movement about the axis 124 and the radial movement, as carried out by means of the pushing elements 128, is separated, whereby the implementation of the corresponding drives and control lines is simplified significantly.

An optimal flat chamber 120 is obtained because of the fact that the required rotating movement of the carrousel as well as the radial movement of the pushing elements take place in one plane.

However, the latter characteristic is not absolutely necessary but preferred. It is definitely possible to arrange the pushing elements 128 with respect to the axis $A_{124}$ at an oblique angle, as indicated by an interrupted line in FIG. 6 and to correspondingly provide the holding devices on the carrousel as well as the openings in the chamber 120. Furthermore, it is also possible to provide, on the carrousel illustrated in FIG. 6, as illustrated by an interrupted line, viewed in the axial direction $A_{124}$, two or more layers of workpieces and to service, by means of pushing elements 128 staggered in this axial direction, chamber openings 122 or even, as illustrated by means of v, to continue to provide the provided pushing elements 128 in a non-rotatable manner but to be shiftable in the axial direction in a controlled manner. As illustrated by 2a in FIG. 6, it is definitely possible to also rotate by means of a separate rotary drive, the pushing elements 128 about the axis $A_{124}$, as indicated by an interrupted line at reference number $128_m$. As recognizable by a person skilled in the art a plurality of possibilities exist of modifying the transport principle implemented on the chamber 120 or 1 according to FIG. 1–2a corresponding to the respective requirements.

Of this plurality of now existing possibilities, another possibility is illustrated in FIG. 7 which permits a significant reduction of the overall height of the transport chamber 120. In this case, the carrousel 124 is constructed such that the smallest workpiece dimension—when these workpieces 126 are disk-shaped, the dimension of their thickness—is disposed in parallel to the carrousel axis 124. The pushing elements 128 are constructed analogously to FIG. 6, and the provided openings 122a become slots.

In the following, the general aspects of the construction of chamber 2 will be discussed as well as the concept of the construction of the facility, while using in each case at least one chamber according to the concept of chamber 1 and of chamber 2.

Figure 8:
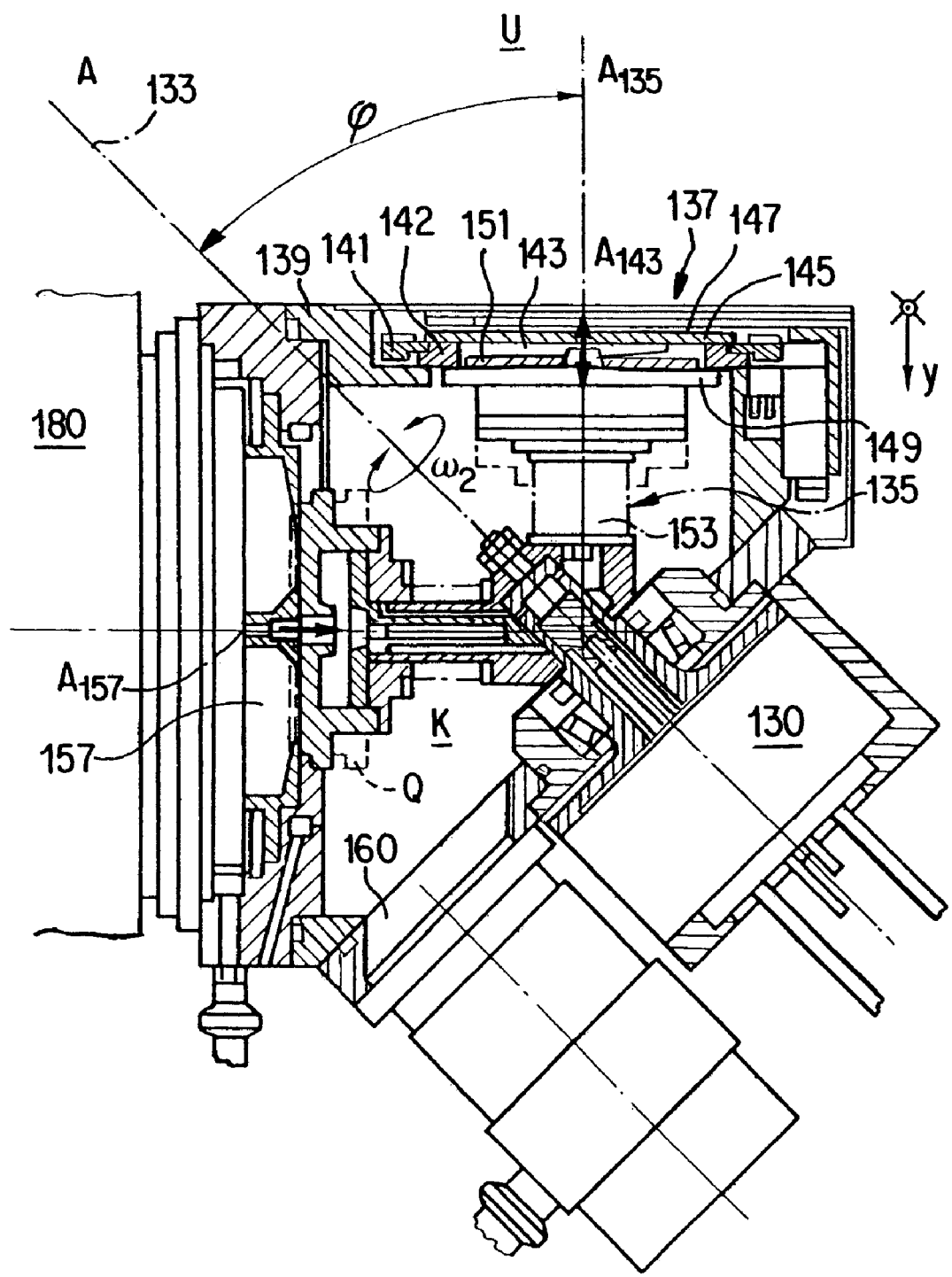
FIG. 8 is a partially sectional further implementation of the chamber. combination according to the invention, as also implemented on the facility according to FIGS. 1 and 2 in a modified manner.

FIG. 8 shows a cross-sectional representation of another embodiment of a chamber 2 according to FIGS. 1, 2. It comprises a driving motor 130 on whose axis A and drive shaft 133 at least one transport arm 135 is fastened with an axis $A_{135}$ that is at an angle, for example, at an angle of 45° with respect to the axis A. When, by means of the motor, the drive shaft 133, as illustrated at reference symbol 2, is driven to carry out rotations, the transport arm or arms 135 sweep over a conical surface, in this case, for example, a 45° cone opening angle. In FIG. 7, the chamber K has two openings to be serviced. A first opening 137 is, for example and as illustrated, constructed directly as a lock-type pass-through opening. In this case, another chamber 180, which may be constructed, for example, according to the principle of the chamber according to FIGS. 5, 6, may possibly not have any pass-through. It comprises a frame 139 and a frame 141 which can be moved up-and down is flanged onto to it. A sealing frame 142, which determines the pass-through volume 143, is situated with a normal line $A_{143}$ inside this driven frame 141 which can be moved up and down. The lock-type pass-through opening 137 also comprises a cover 145 which is, for example, linearly shiftable in the direction x. It is naturally also possible that it can be swivelled about an axis that is perpendicular in FIG. 7, for the purpose of an opening and closing. In its closed illustrated position, it is placed in a sealing manner on the sealing frame 142 by means of the lowering of the intermediate frame 141 in the direction y.

Thus, the lock-type pass-through opening 137 is sealed off with respect to the environment U.

On its end, the transport arm 135 carries a plate 149 as the supporting part, on which a workpiece rests that is to be treated and which in the illustrated embodiment is a storage disk 151. As illustrated by an interrupted line, on the transport arm 135, the plate 149 can be moved back from its seat (entered in the drawing) on the sealing frame 142 toward the axis A and thus the lock can be opened on the side of the transport device. The plate 149 does not have to rest tightly against the frame 142 if an atmosphere does not have to be maintained in the chamber K which must meet the highest requirements with respect to purity. By means of the transport arm, the workpiece 151 is transported by the rotation of the shaft 133 by means of the motor 130 to the second illustrated opening 157. The radial driving mechanism on the transport arm 135, whose construction actually does not affect the present invention and which can be implemented in many different fashions by a person skilled in the art, is provided,—and this is important—directly on the rotatable sort arm and is sealed off by means of bellows 153 in a vacuum-tight manner with respect to the environment in the chamber K. By the rotation of the transport arm 135, the workpiece 151, specifically, the disk, is transported into the area of the second opening 157. The opening 157 determines the normal surface line $A_{157}$ of the opening. From the approach position Q, which is illustrated by an interrupted line, the transport plate 149 with the workpiece 151 is lifted back into the position illustrated by a solid line by means of the mentioned, for example, pneumatic lifting mechanism on the arm 135 so that the plate 149 will now be placed against the edge of the opening 157 in a sealing manner.

With respect to the environment U, the chamber K is preferably constructed in a vacuum-tight manner. Depending on its usage (not shown), devices are provided on the stations coupled to the openings of the chamber K and/or of the transport chambers and/or on chamber K itself and/or on the lock-type pass-through opening 137, in order to adjust respective atmospheres in a targeted manner; that is, evacuation connections and/or gas inlets are provided there. FIG. 8 illustrates a pump connection 160 for chamber K and possibly the lock-type pass-through opening 137.

When the chamber is constructed such that all chamber openings are sealingly closed by one of the provided arms 135 respectively, this results in the possibility of providing the respective atmospheres in the treatment stations and/or transport chambers and/or lock-type pass-through stations, which are assigned to the openings, independently of that in the chamber K. However, in certain cases, it may definitely be sufficient to provide a common atmosphere for at least another chamber or station and the chamber K, whereby then, for example, only chamber K must be conditioned or evacuated, as illustrated, for example, in FIG. 8, the lock-type pass-through opening 135 together with the chamber K.

Figure 9:
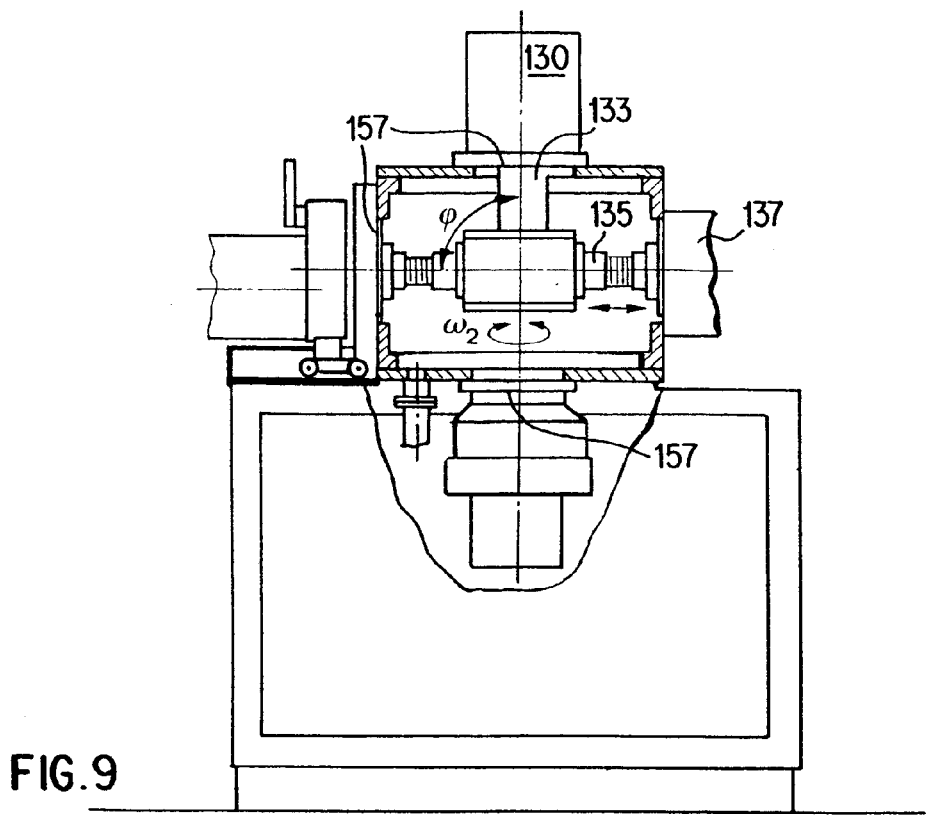
FIG. 9 is a basic view of the chamber combination according to FIG. 8 in a further implementation.

FIG. 9 is a partial sectional view of a chamber according to the principle of chamber 2 in FIGS. 1 to 2a, in which the arms 135 project perpendicularly from the shaft 133 of the motor 130, whereby=90°.

Figure 10:
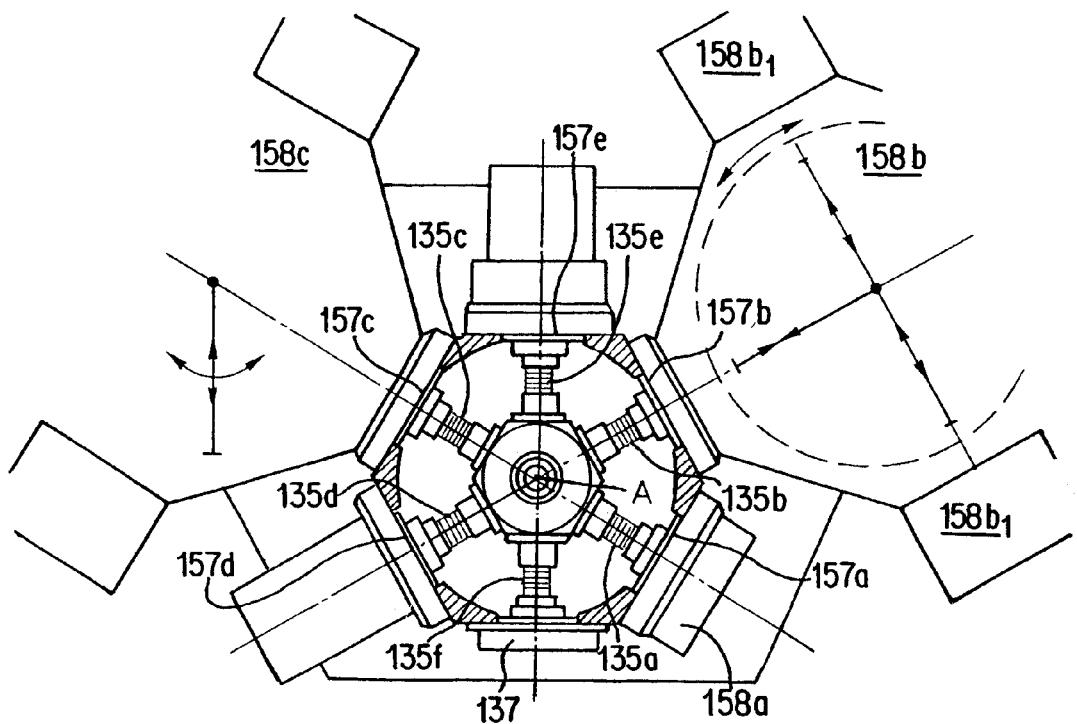
FIG. 10 is a top view and a partially sectional view of a combination of the invention according to FIG. 9.

FIG. 10 is a top view of the chamber which is part of a facility in the configuration according to FIG. 9. The same reference symbols mark identical components. For example, six transport arms 135a to 135f are arranged about the axis A, analogously to FIG. 9, and service alternately, for example, a lock-type pass-through station 158 for the feeding and delivery of disks 151 and a transport chamber 158b with stations $158b_1$, additional five chambers or treatment stations through openings 157a to 157e.

The opening 157b is assigned, for example, to a transport chamber 158b with the carrousel and pushing elements, analogously to chamber 1 or those explained by means of FIGS. 6 and 7. This chamber 158 is connected with additional treatment stations and/or additional transport stations. The opening 157c, in turn, is connected, for example, with another chamber 158c of the type according to chamber 2 of FIG. 1 and as further explained in connection with FIG. 8; the latter is in turn connected with other treatment and/or transport and/or lock-type chambers. The illustrated configuration of the overall facility only has the purpose of furnishing an example of the flexible and modular manner in which facilities can be combined with chambers of the type according to chamber 1 of FIGS. 1 to 2a and/or of the type of chamber 2 of FIGS. 1 to 2a. This flexibility will be discussed further, in which case the chamber type symbols are used in FIG. 10 which will be defined in the following.

Figure 11:
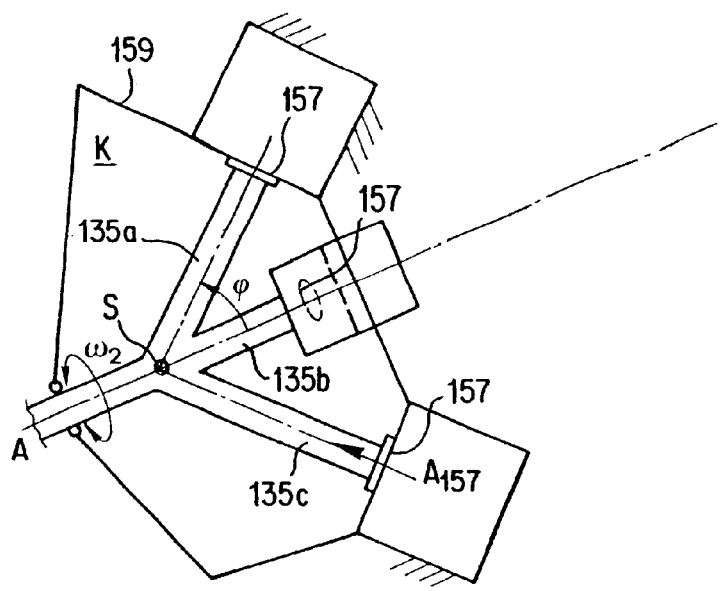
FIG. 11 is a schematic view of the fundamental principle of the combination according to FIGS. 8 to 10 and according to FIGS. 1 and 2.

FIG. 11 is a schematic view of the fundamental principle of chamber K which was explained by means of FIGS. 1, 2, 8 to 10. The entered three openings 157, for example, are serviced by means of the, for example, three transport arms 135a to 135 shown here which rotate about the axis A. The chamber K is bordered by the schematically entered boundary 159. During its rotation 2, the transport device sweeps over a conical surface with an opening angle and services the openings 157 which determine the normal surface lines 157. The latter are directed in the direction of surface lines of the swept-over cone. The openings 157 are situated on a great circle of the swept-over conical surface; that is, they all have the same distance from the apex S of the cone swept over by the arms 135.

Figure 12:
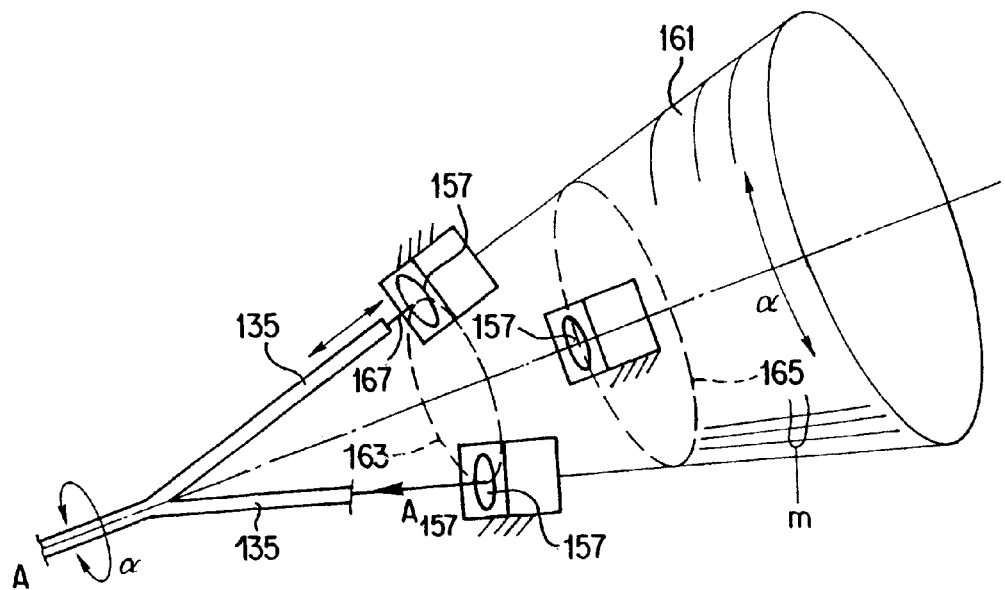
FIG. 12 is a schematic view of a further development based on a combination according to FIG. 11.

FIG. 12 illustrates another possibility. In this case, on the illustrated cone 161 swept over by the arms 135, openings are situated on one great circle 163 and others, only one of which is shown, are situated on the great circle 165. The normal lines $A_{157}$ of the opening surfaces point in turn into the direction of the lines of the envelope of the cone m. In order to service the openings 157 which are situated on different great circles 163, 165, the arms 135, as illustrated schematically at reference number 167, can be lengthened and shortened in a driven manner, for example, by way of a pneumatic telescope drive, covered, for example, by means of the bellows not shown here, analogous to the bellows 153 of FIG. 8. This makes it possible to arrange openings 157 not only on a great circle, as in the case of the chamber according to FIGS. 8 to 10, but preferably azimuthally—staggered, on several great cone circles.

Figure 13:
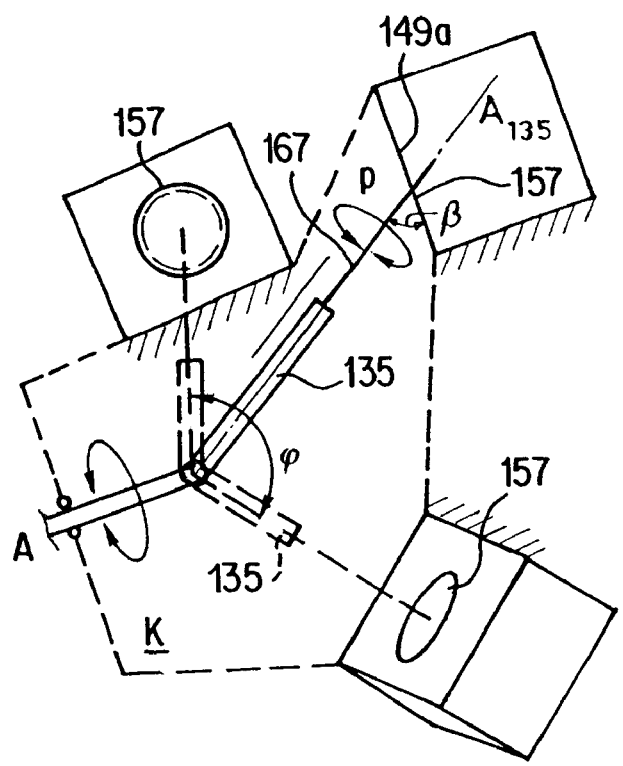
FIG. 13 is a view of a further development based on the variant of the chamber combination according to FIG. 12.

In a further development of the chamber K according to FIG. 13, the arms 135, illustrated again at reference number 167, can also be moved out and moved back and carry a transport plate 149a. In addition, the cone angle can be adjusted in a driven manner so that a sweeping-over cones with different opening angles may take place. Thus, arbitrarily arranged openings 157 may be serviced within wide ranges. Also, the carrier plate 149a is disposed at an angle β<90° on the respective arm 135 and, as illustrated at p, can be rotated about the arm axis $A_{135}$. The cone angle adjustment, as well as the moving-in and moving-out of the arm as well as the rotation at p take place in a controlled driven manner, whereby such an arrangement makes it possible to service the openings 157 which are virtually arranged arbitrarily with respect to space. The boundary of chamber K is indicated by an interrupted line.

Figure 14:
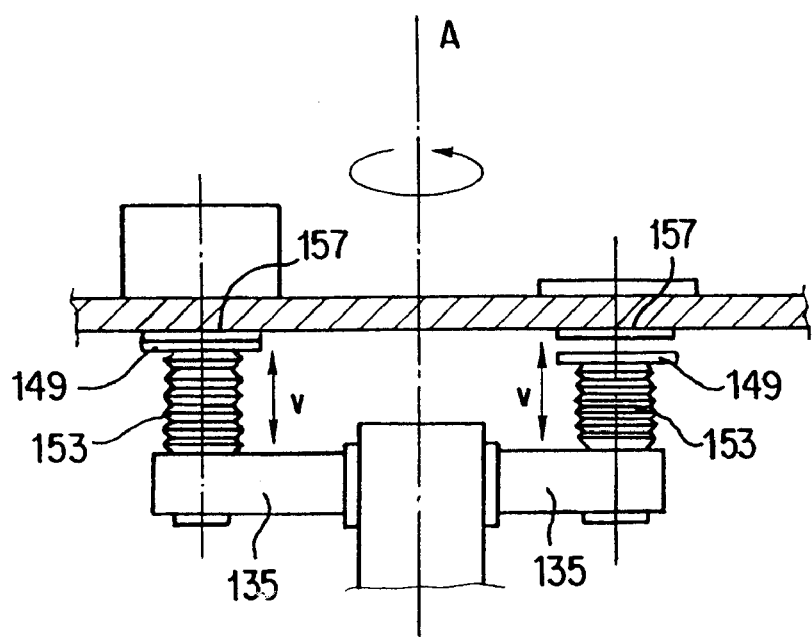
FIG. 14 is a partially sectional view of another embodiment of a chamber for a combination according to the invention.

According to FIG. 14, the arms are constructed and disposed in such an L-shape that they are situated in parallel to the axis of rotation A. If the axis or axis of rotation A is perpendicular, this has the important advantage that workpieces do not have to be held on the plates 149. The drives for the movement v of plates 149 are situated inside the bellows 153.

Figure 15:
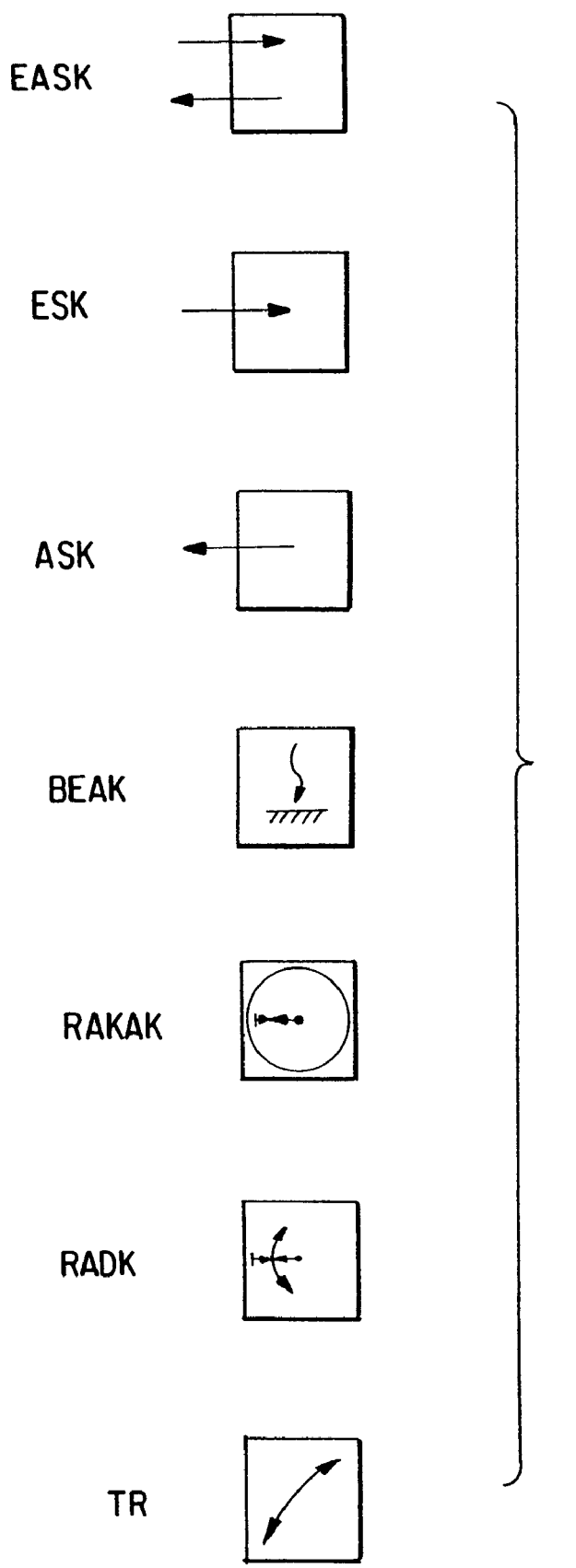
FIG. 15 is a view of the definition of graphic symbols for different types of chambers.

The following chamber types will now be defined and, for a graphic simplification, are shown in FIG. 15 with the abbreviations defined here:

1. Feeding and Delivery Lock-Type Pass-Through Chamber (EASK)

A lock-type pass-through chamber by means of which workpieces may be transported through in both directions.

2. Feeding Lock-Type Pass-Through Chamber (ESK)

A lock-type pass-through chamber at which workpieces are passed through only in the direction of their vacuum surface treatment.

3. Delivery Lock-Type Pass-Though Chamber (ASK)

A lock-type pass-through chamber by means of which workpieces can be transported through only in the direction away from the vacuum surface treatment.

4. Treatment Chamber (BEAK)

A chamber in which workpieces are surface-treated, for example, abraded, coated, cleaned, heated, cooled, etc.

5. Radially Serviced Carrousel Chamber (RAKAK)

A transport chamber of the type illustrated and explained by means of chamber 1 in FIGS. 1 and 2 as well as in FIGS. 6, 7.

6. Radially Serviced Star-Type Rotating Chambers (RADK)

A chamber of the type of chamber 2 of FIG. 1 and, as further illustrated and explained in connection with FIGS. 8 to 14.

7. Transport Chamber (TR)

A chamber in which workpieces are shifted between at least two openings, which includes chambers EASK, ESK, ASK, RAKAK and RADK, but especially also chambers with different transport mechanisms than those shown and described with respect to chambers RAKAK and RADK.

Figure 16:
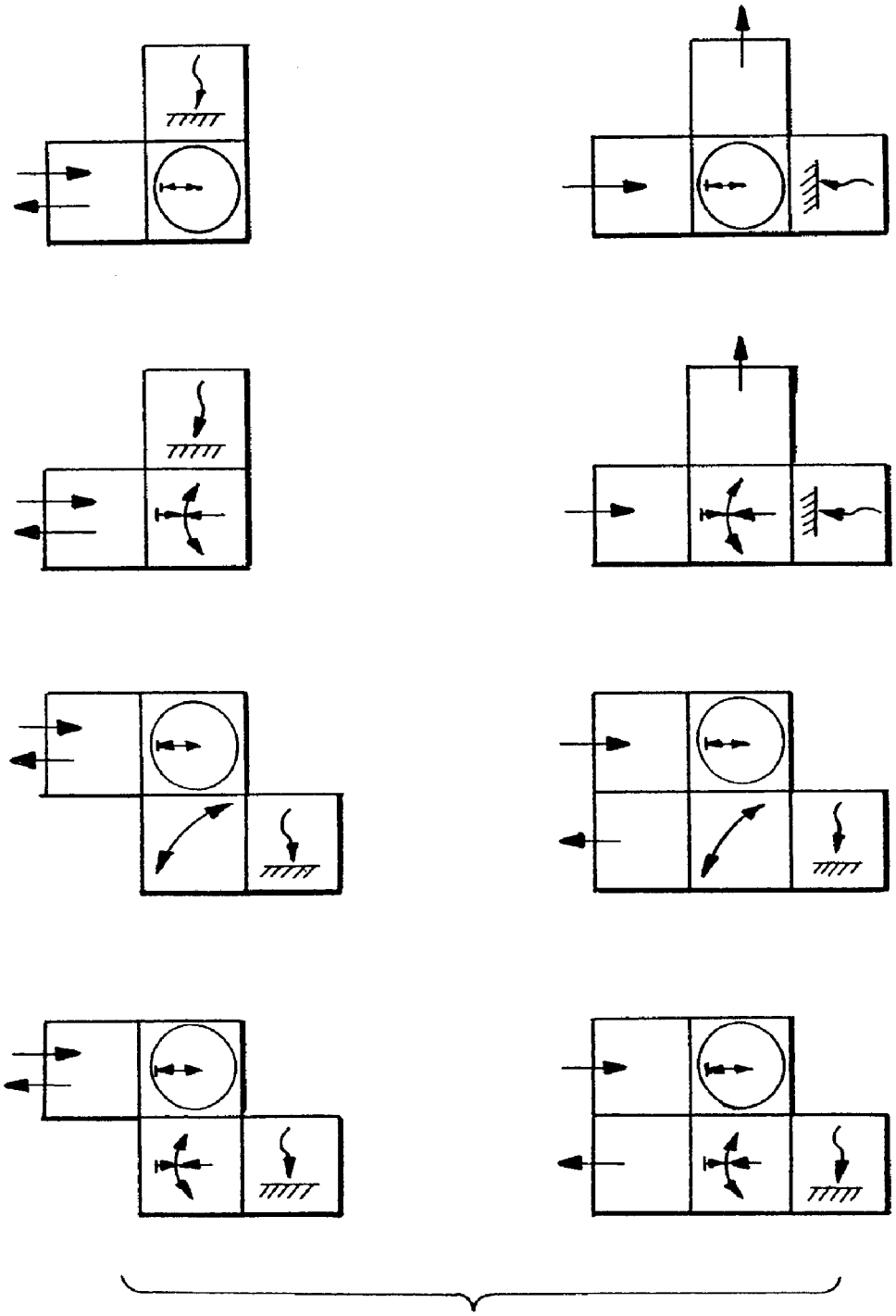
FIG. 16 is a view of embodiments of configurations of the facility or chamber combinations with a modular construction of at least one of the chambers according to the principle of the chambers of FIGS. 1 and 2.

FIG. 16 illustrates several configurations of facilities, wherein at least one of the chambers is a RAKAK or RADK chamber. This demonstrates that, by means of the two chamber types as well as other known chambers, arbitrary modular system configurations can be combined with the highest flexibility with or without the integration of the masking concept according to FIG. 5. The approach according to the invention is particularly suitable for the treatment of magneto-optical storage disks.

Figure 17:
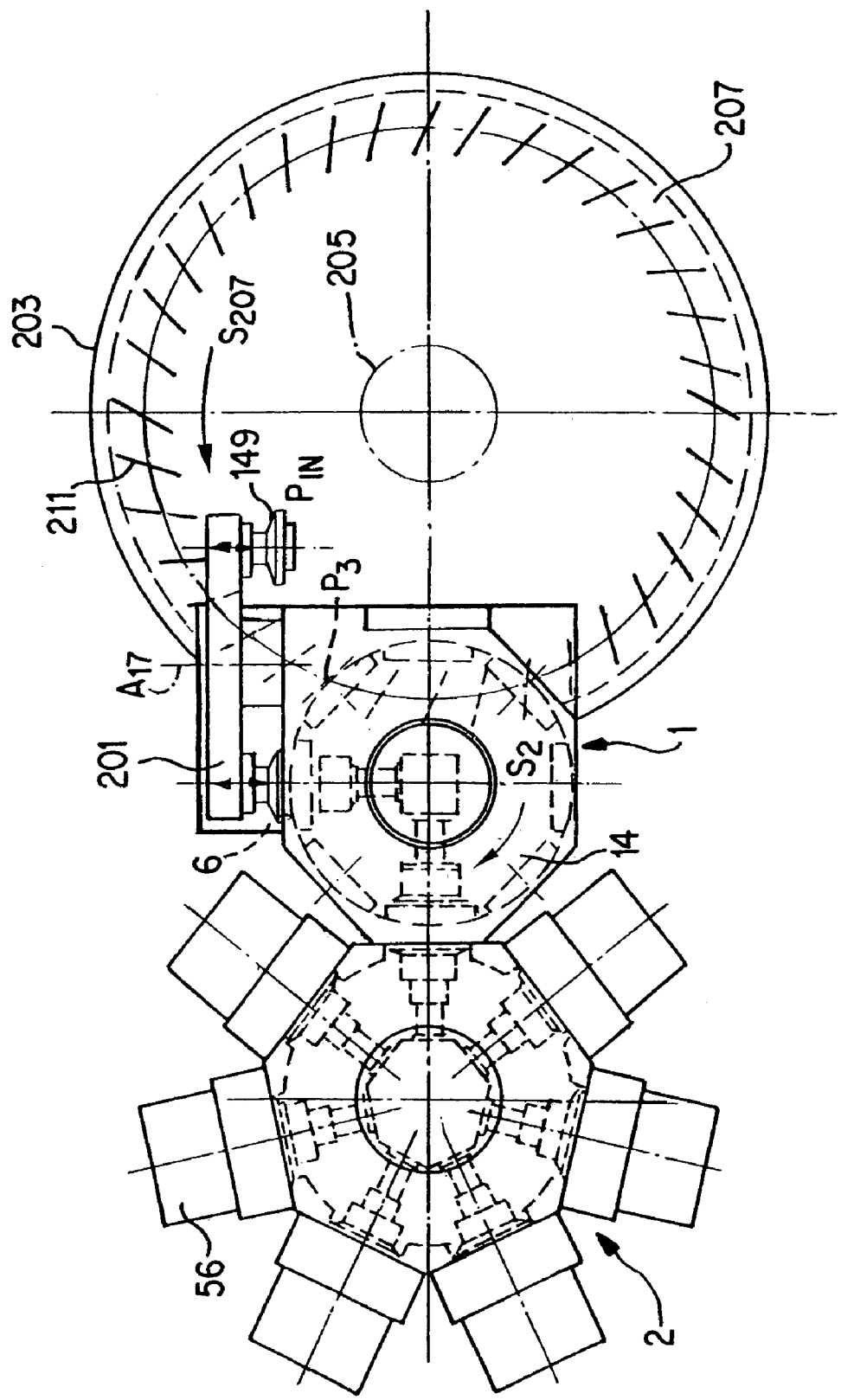
FIG. 17 is a schematic top view of another preferred configuration of the facility in a modular construction.
Figure 18:
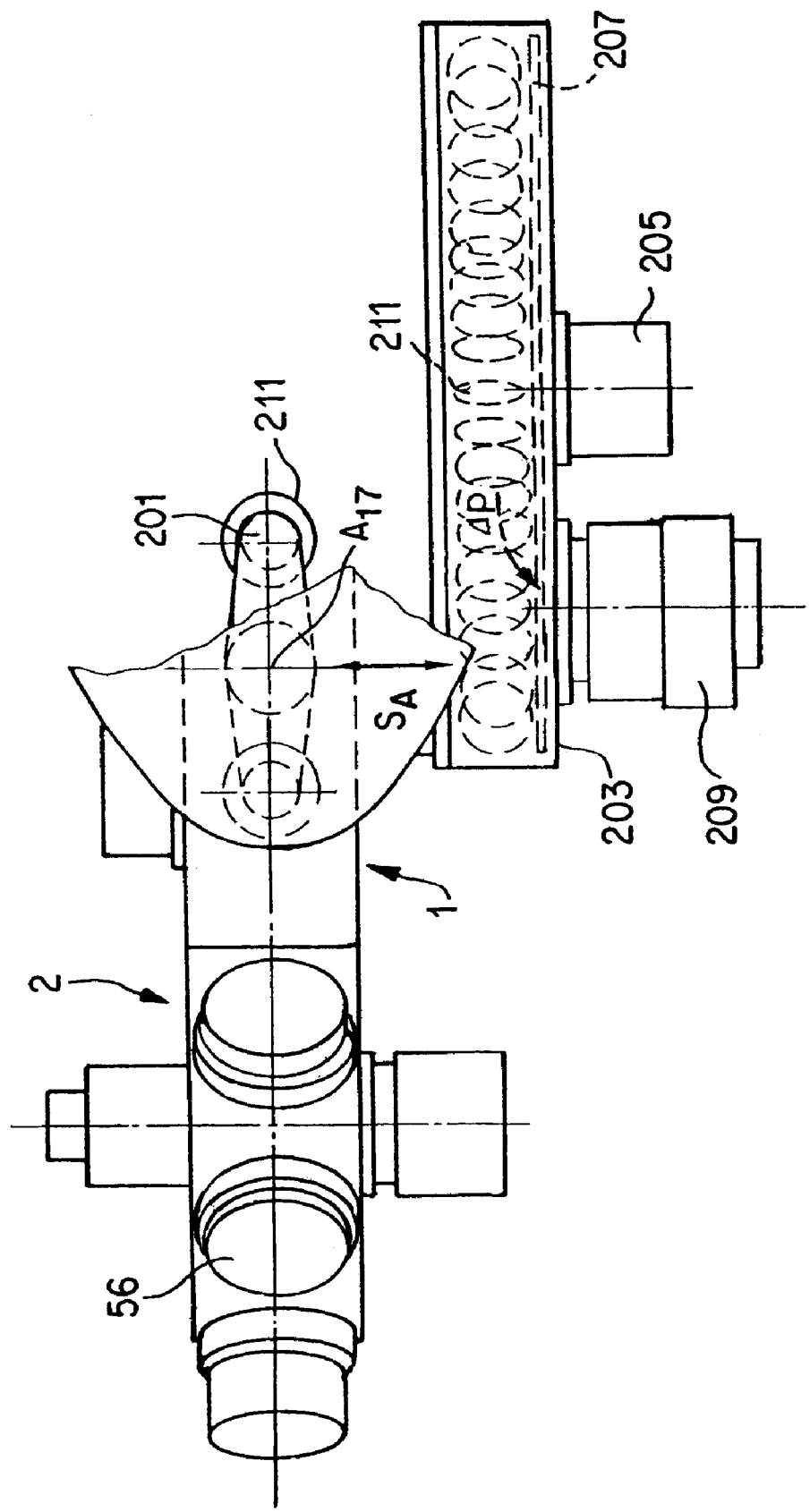
FIG. 18 is a schematic lateral view of the facility in the configuration according to FIG. 17.

FIGS. 17 and 18 schematically illustrate in a top view and a lateral view respectively a further preferred configuration of the facility. It comprises the chamber 2, as explained particularly by means of FIGS. 1 and 2 as well as the chamber 1 which is also described there. The opening 6 of the chamber 1, which is in particular illustrated in FIG. 2, is serviced by a rotating robot arm 201 analogously to the one illustrated in FIG. 14 and is rotationally movable while being driven about the axis $A_{17}$. By means of the plates 149 which can be moved axially toward the front and back, the disk-shaped substrates are received in position $P_{iN}$, as illustrated schematically, and are brought into the position on the opening 6 by means of the rotation of the robot arm 201. As described by means of FIG. 2, they are transferred to the chamber 1 there. Then the carrousel 14 continues to rotate into the direction $S_2$ about an increment of the angle of rotation. The just introduced disk-shaped substrate is in position $P_3$ in the carrousel.

As illustrated particularly in FIG. 18, a degasification chamber 203 is arranged below the chamber 1 which comprises a rotary transport plate 207 driven by a centric drive 205. The degasification chamber 203 is pumped separately by a vacuum pump 209. In position $P_3$ of the substrate according to FIG. 17, the latter is transported in the direction $S_A$ according to FIG. 18 by means of a transport slide, which is not shown, from the upper position in chamber 1 into the position beneath it in the degasification chamber 203. While the carrousel 14 in chamber 1 continues to be stationary, by means of the drive 205, the transport plate 207 in chamber 203 is rotated farther by an angle increment in the direction indicated in FIG. 17 by reference symbol $S_{207}$. As a result, one of the substrates 211 comes to be situated in the position below $P_3$ and has carried out a full revolution in the chamber 203.

By means of the above-mentioned transport slide, the latter substrate will now be lifted in the direction SA from chamber 203 into position $P_3$ in chamber 1 and will take up that space on the carrousel 14 that had just been occupied by a substrate newly fed to chamber 203. Then the carrousel 14 in chamber 1 is rotated farther by one increment of the angle of rotation in the direction $S_2$.

It can now easily be recognized that all substrates starting from position $P_3$ in chamber 1 leave this chamber and are degasified for a long period of time in the degasification chamber 203 which may be promoted by providing, for example, additional heating elements in this chamber 203 (not shown), until, at the above-mentioned position $P_3$, they are received back in chamber 1 and are guided to their treatment However, in this case, the working cycle of the overall facility is not slowed down. As described by means of FIGS. 1 and 2, the workpieces are transferred from chamber 1 to chamber 2 and are treated there by means of the illustrated, for example, six treatment stations 56. Because of the dimension of the degasification chamber or its receiving capacity, the necessary degasification time for the respective application can easily be predetermined.

During the transfer of the disk-shaped workpieces—substrates 211—from chamber 1 into the degasification chamber 203, by means of the above-mentioned transport slide, a respective lock-type separation may be ensured from chamber 1 to chamber 203. The vacuum pump 209 ensures that degasification products are removed from chamber 203. It ensures a pressure gradient in chamber 203 in the direction of the pump 209, as indicated by an interrupted line at p in FIG. 18.

What is claimed is:

1. A vacuum chamber, comprising a transport arrangement with at least two workpiece holders, a drive for driving said transport arrangement along a transport path, at least two openings in the wall of the chamber arranged such that each of said at least two workpiece holders of said transport arrangement is alignable by said transport arrangement with each of said at least two openings, at least two conveyors aligned or alignable with said at least two openings, each of said conveyors arranged to be drivingly movable towards and from respective ones of said at least two openings, the transport path of said at least two workpiece holders leading through a space in between said conveyors and said openings, said workpiece holders being operatively mounted to a base of said transport arrangement via a leaf spring arrangement, said conveyor being arranged to convey respective ones of said workpiece holders towards said oening against a bias of said leaf spring arrangement.

2. The vacuum chamber of claim 1, wherein said workpiece holders comprise workpiece holders for flat, disk-shaped workpieces held substantially parallel to said openings, said leaf spring arrangement linking said workpiece holders to said base of said transport arrangement substantially in planes parallel to planes of the openings.

3. The vacuum chamber of claim 1, wherein said workpiece holders comprise a plate-like member with an opening, holding members for flat workpieces being substantially aligned in said opening, said plate-like member being mounted via said leaf spring arrangement to said base of said transport arrangement.

4. The vacuum chamber of claim 1, wherein said transport arrangement is a transport rotor with said at least two workpiece holders remote from and rotatable around an axis in said chamber.

5. The vacuum chamber of claim 4, wherein said at least two conveyors comprise a transport device centrally located with respect to the said transport rotor and are arranged to be movable at least with a movement component in a radial direction with respect to said axis to and from said workpiece holder.

6. The vacuum chamber of claim 5, wherein said conveyors comprise independently controllable drives.

7. The vacuum chamber of claim 5, wherein said transport device is arranged to be drivingly rotatable around said axis.

8. The vacuum chamber of claim 7, wherein said transport device is rotatable around said axis independently of rotation of said transport rotor.

9. The chamber of claim 4, wherein said at least two openings are arranged along a common circular locus coaxial with said axis.

10. The chamber of claim 4, wherein said transport arrangement is a carousel.

11. The chamber of claim 4, wherein said workpiece holders are mounted to said transport rotor so as to be linearly displaceable at least in a radial direction against biasing of said leaf spring arrangement.

12. The vacuum chamber of claim 1, wherein said conveyors are stationarily mounted in said chamber aligned with said at least two openings.

13. The vacuum chamber of claim 1, wherein said workpiece holders form a seal with said openings, once driven towards said openings by said conveyors.

14. The chamber of claim 1, wherein at least one of said conveyors, said workpiece holders and workpieces disposed in said workpiece holders are arranged to obstruct a clearance of a respective one of said two openings when said workpiece holder is moved towards said opening.

15. The chamber of claim 14, wherein obstruction of said clearances comprises a sealing.

16. The chamber of claim 15, wherein said sealing is one of form sealing, force sealing and gap sealing.

* * * * *